(12) United States Patent
Ackerman et al.

(10) Patent No.: US 6,215,801 B1
(45) Date of Patent: Apr. 10, 2001

(54) WAVELENGTH STABILIZED LASER

(75) Inventors: David Alan Ackerman, Hopewell; Philip J. Anthony, Bridgewater; John VanAtta Gates, New Providence; Dirk Joachim Muehlner, Murray Hill, all of NJ (US)

(73) Assignee: Lucent Technologies, Inc., NJ (US)

( * ) Notice: Subject to any disclaimer, the term of this patent is extended or adjusted under 35 U.S.C. 154(b) by 0 days.

(21) Appl. No.: 09/263,713

(22) Filed: Mar. 5, 1999

(51) Int. Cl.$^7$ ........................................... H01S 3/13
(52) U.S. Cl. ................ 372/32; 372/31; 372/38; 372/29; 372/6
(58) Field of Search ................ 372/32, 9.6, 38, 372/31, 29, 33

(56) References Cited

U.S. PATENT DOCUMENTS

| | | | |
|---|---|---|---|
| 4,914,662 | * | 4/1990 | Nakatani et al. ............ 372/32 |
| 5,200,967 | * | 4/1993 | Miyata et al. ............... 372/32 |
| 5,331,651 | * | 7/1994 | Becker et al. ............... 372/32 |
| 5,825,792 | * | 10/1998 | Villeneuve et al. .......... 372/32 |

FOREIGN PATENT DOCUMENTS 9705679   2/1997   (WO) .

OTHER PUBLICATIONS

Subpicometer Accuracy Laser Wavelenght Sensor Using Multiplexed Bragg Gratings by Feng Zhao et al. IEEE Photonics Technology Letters. 9, No. 11. Nov. 1997.

A Compact Wavelength Stabilization Scheme for Telecommunication Transmitters by Villeneuve et al.

* cited by examiner

*Primary Examiner*—Leon Scott, Jr.

(57) ABSTRACT

An apparatus for stabilizing the wavelength of light emitted by a laser or light source comprising a divider for dividing a sample of emitted light into a first and second portion; a first photodetector configured to measure an intensity of the first portion and a second photodetector configured to measure an intensity of the second portion, the second photodetector configured to receive the emitted light via an optical frequency discriminator, such as a dielectric coating, wherein the optical frequency discriminator is configured to modify the intensity of the emitted light at the second photodetector as a function of an optical frequency of the emitted light; and a processor configured to maintain a desired level corresponding to a ratio of the intensity measured by the first photodetector and the intensity measured by the second photodetector, so as to provide a feedback control signal to adjust the wavelength of the emitted light. In one embodiment, the first and second photodetectors are photodetector diodes having a base electrode, a first electrode and a second electrode. The diode is configured to generate an electrical current between the base electrode and the first electrode corresponding to the intensity of light received by the first photodetector and to generate an electrical current between the base electrode and the second electrode corresponding to the intensity of light received by the second photodetector. In still another embodiment, the sample is a back-facet emission emitted by the source, wherein the entire apparatus is disposed on a silicon chip having the frequency discriminating dielectric coating applied directly to its surface.

26 Claims, 4 Drawing Sheets

WAVELENGTH DISCRIMINATION ARRANGEMENT

WAVELENGTH STABILIZED LASER

FIELD OF THE INVENTION

This invention relates to lasers, and more specifically to a system and method for stabilizing the wavelength of a laser or light source.

BACKGROUND OF THE INVENTION

Stabilizing the wavelength of a laser or light source is important in many applications. One such application is a telecommunication system that employs wavelength division multiplexing, in which a plurality of lasers or light sources each emit signals having different wavelengths that are multiplexed over a single fiber-optic cable. In this application, the plurality of signals having different wavelengths are demultiplexed after transmission across the fiber-optic cable and are delivered to corresponding recipients.

Due to the increased demands placed on telecommunication systems, it is increasingly desirable that fiber-optic cables employed in a wavelength division multiplexing system be capable of handling a large number of signals. Unfortunately, increasing the number of signals handled by a fiber-optic cable requires that the wavelengths of the different signals be closer together, which in turn increases the likelihood that the wavelengths of the signals will wander, and interfere with each other.

Additionally, it has been recognized that, over long periods of usage, laser and light sources gradually experience wavelength drift. In the short term, differences in temperature at a source can also cause fluctuations in the wavelength of the emitted light from a laser. Thus, in order to minimize the likelihood of wavelength crosstalk, it is necessary to stabilize the wavelengths of telecommunications transmitters.

Several methods have been devised for measuring and stabilizing wavelengths. FIG. 1 is a diagram that illustrates a prior art apparatus employing one such method, as disclosed in International Publication No. WO 97/05679 of PCT Application No. PCT/CA96/00416, published Feb. 13, 1997. In the figure, a Fabry-Perot etalon filter 14a receives light emitted from source 10, and based upon the wavelength of the light received, outputs a signal to detector 16a. The intensity of the signal detected by detector 16a is fed to circuit 11. Circuit 11 is also fed the intensity of the light detected by detector 16b, which receives a reference signal from source 10 via beam splitter 12. Circuit 11 compares the signals that it receives from detectors 16a and 16b, and adjusts the wavelength produced by source 10 if the ratio of the intensities of the two received signals changes beyond pre-determined limits.

FIG. 2 is a diagram that illustrates another prior art method, as disclosed in B. Villeneuve, H. Kim, M. Cyr and D. Gariepy, *A Compact Wavelength Stabilization Scheme for Telecommunication Transmitters*, Ontario, Canada. In the figure, source 10 emits light having a frequency which is received by photodetectors 16a and 16b via Fabry-Perot (hereinafter "FP") filter 14. The angular behavior of FP filter 14 (which varies the wavelengths of light received depending on the cosine of its tilt angle) results in differing spectral responses at photodetectors 16a and 16b. The differing spectral responses are converted into a discrimination signal 18, which is utilized to stabilize the wavelength.

These and other prior art methods (such as the use of holographic crystals, which are not shown) require the use of optical elements that are neither compact nor simple to implement. Furthermore, these and other prior art methods are not programmable or adjustable for various desired frequency channels.

Thus, there is a need for an improved apparatus for stabilizing the wavelength of a laser.

SUMMARY OF THE INVENTION

The present invention, in accordance with one embodiment, provides an apparatus for stabilizing the wavelength of light emitted by a laser or light source. In one embodiment, the invention comprises a divider for dividing a sample of emitted light into a first and second portion. The invention also comprises a first photodetector configured to measure an intensity of the first portion and a second photodetector configured to measure an intensity of the second portion. The second photodetector is configured to receive the emitted light via an optical frequency discriminator, such as a dielectric coating, wherein the optical frequency discriminator is configured to modify the intensity of the emitted light at the second photodetector as a function of an optical frequency of the emitted light. The invention also comprises a processor configured to maintain a desired level corresponding to a ratio of the intensity measured by the first photodetector and the intensity measured by the second photodetector, so as to provide a feedback control signal to adjust the wavelength of the emitted light. According to one embodiment, the processor is programmable.

According to one embodiment, first and second photodetectors are photodetector diodes having a base electrode, a first electrode and a second electrode. The diode is configured to generate an electrical current between the base electrode and the first electrode corresponding to the intensity of light received by the first photodetector and to generate an electrical current between the base electrode and the second electrode corresponding to the intensity of light received by the second photodetector.

In still another embodiment, the sample is a back-facet emission emitted by the source. In this embodiment, the entire apparatus is disposed on a silicon chip. In another embodiment, the silicon chip has a surface that is mirrored, and a dielectric coating is applied directly to the surface of the mirrored silicon chip so as modify the intensity of the light received at one of the photodetectors.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

The present invention, in accordance with one embodiment, comprises an apparatus for stabilizing the wavelength of a laser or light source. In accordance with one embodiment, the invention is employed by a telecommunication system using wavelength division multiplexing, wherein a laser is configured to generate signals having different wavelengths that are multiplexed for transmission via a fiber-optic cable.

Figure 1:
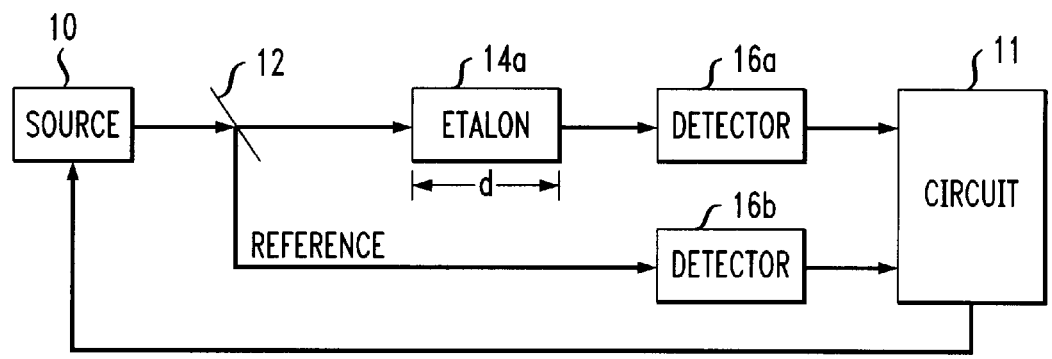
FIG. 1 illustrates an apparatus for stabilizing the wavelength of a laser, according to the prior art.
Figure 2:
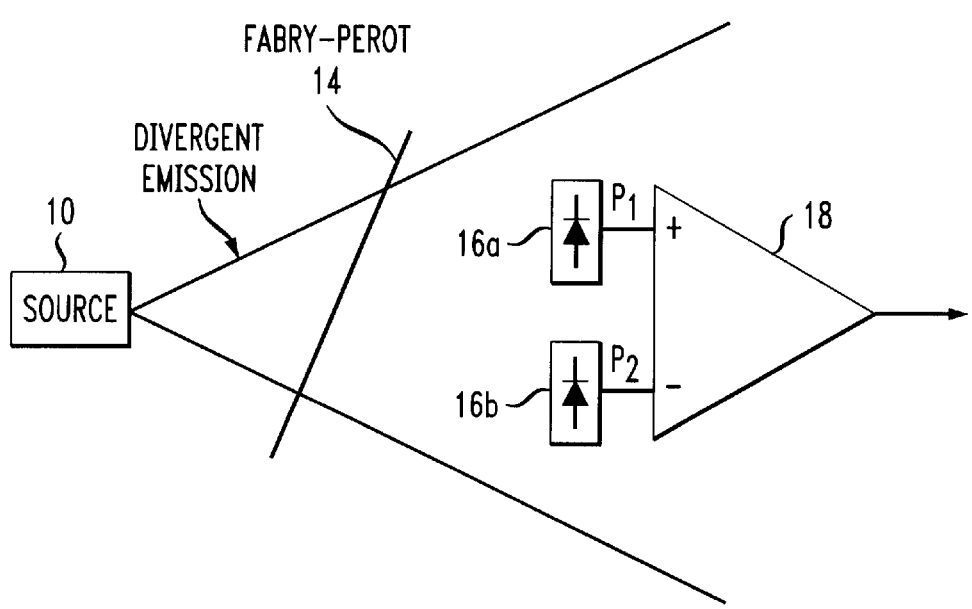
FIG. 2 illustrates another apparatus for stabilizing the wavelength of a laser, according to the prior art.
Figure 3:
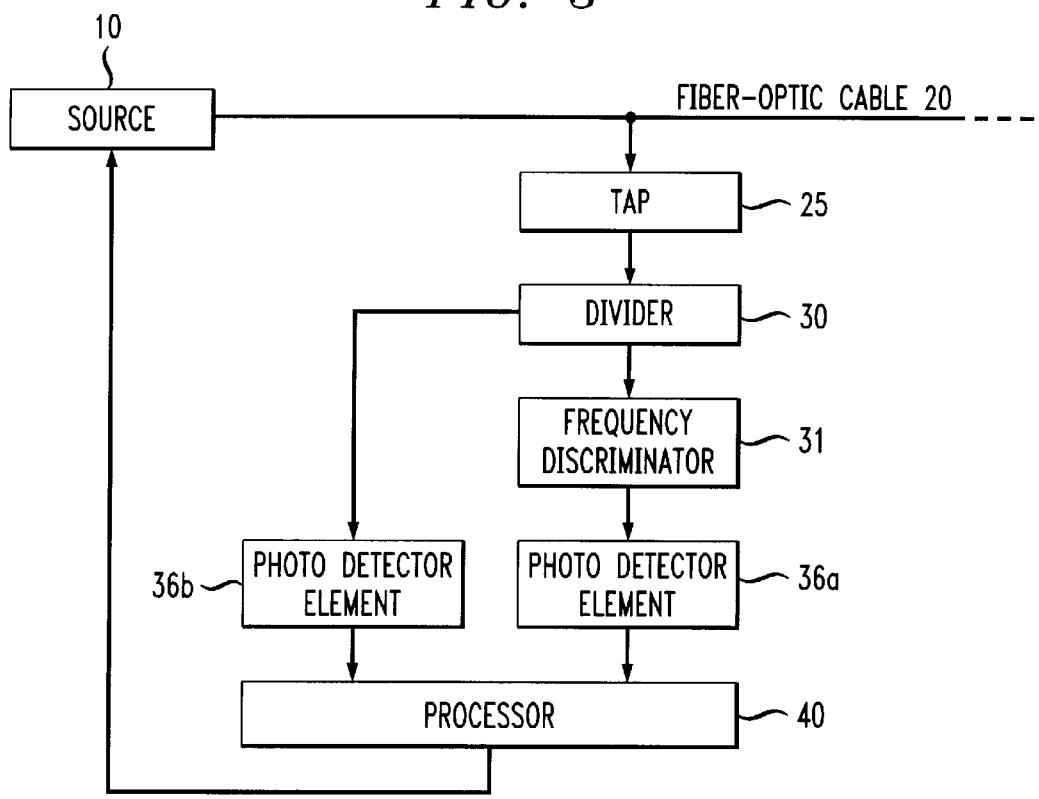
FIG. 3 illustrates an apparatus for stabilizing the wavelength of a laser or light source, according to one embodiment of the invention.

FIG. 3 illustrates an apparatus to stabilize the wavelength of a laser or light source, according to one embodiment of the invention. Laser or light source 10 is configured to emit light at a specific wavelength, preferably for transmission over fiber-optic cable 20. Tap 25 is coupled to fiber-optic cable 20, and is configured to tap a small fraction of the emitted light (e.g.—typically between 1% and 20%, but preferably about 5%) and feed it to divider 30. Divider 30 is configured to receive the tapped light and to divide it, preferably into two portions of equal intensity, and to feed the two portions to a pair of photodetectors.

In the embodiment shown, photodetector 36a receives a portion of the tapped light via optical frequency discriminator 31, which will be explained more fully below, while photodetector 36b receives the portion of the tapped light directly. Each of the photodetectors generate a signal that is fed to processor 40.

Processor 40 receives the signals and performs operations in accordance with one embodiment of the invention, as will be described in more detail below. Processor 40 is in turn coupled to source 10 and, in one embodiment, provides a feedback control signal to source 10. According to one embodiment, source 10 adjusts the wavelength of the emitted light according to the feedback control signal received from processor 40.

Figure 4:
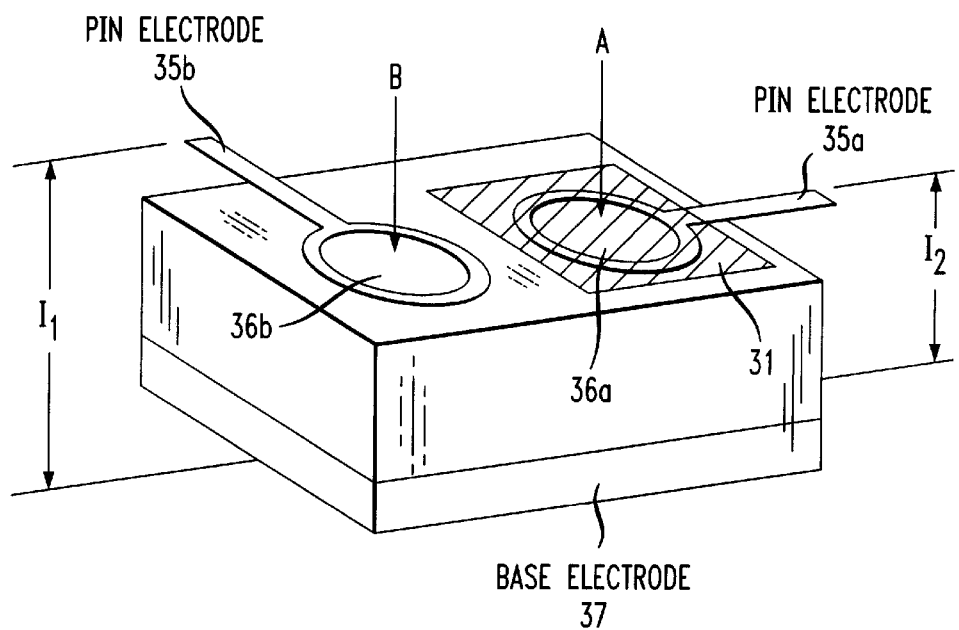
FIG. 4 illustrates a photodetector diode, in accordance with one embodiment of the invention.

According to the preferred embodiment of the invention, photodetector elements 36a and 36b are formed on a semiconductor device to define a photodetector diode 35, as generally known in the prior art. FIG. 4 illustrates diode 35, in accordance with one embodiment of the invention. When portion B of the light sample is received by photodetector element 36b of diode 35, an electrical current $I_1$ is generated between base electrode 37 of the diode and electrode 35b, corresponding to the intensity of the light received by photodetector 36b. Similarly, when portion A of the light sample is received by photodetector element 36a of diode 35, an electrical current $I_2$ is generated between base electrode 37 of the diode and electrode 35a, corresponding to the intensity of the light received by photodetector 36a. Electric currents $I_1$ and $I_2$ are fed to processor 40 as previously discussed.

Optical frequency discriminator 31 is a passive optical element that is configured to modify the intensity of the light as a function of, and preferably proportionally to, the optical frequency of the light received. It should be noted that, in the preferred embodiment, the properties of optical frequency discriminator 31 varies only with the optical frequency of the lightwave, and not with the modulating pulse frequency, although the invention is limited in scope in this regard. As is well known in the art, the optical frequency of a lightwave (such as the lightwave emitted by source 10) and the wavelength of the same lightwave are related by the formula $f \times \lambda = k$, wherein $f$ is the optical frequency of the light wave, $\lambda$ is the wavelength of the lightwave, and k is a constant.

In another embodiment, optical frequency discriminator 31 is preferably a dielectric coating which is applied to photodetector 36a. Alternatively, optical frequency discriminator 31 is a dielectric coating that is applied to a surface through which photodetector 36a receives the emitted light.

Figure 5:
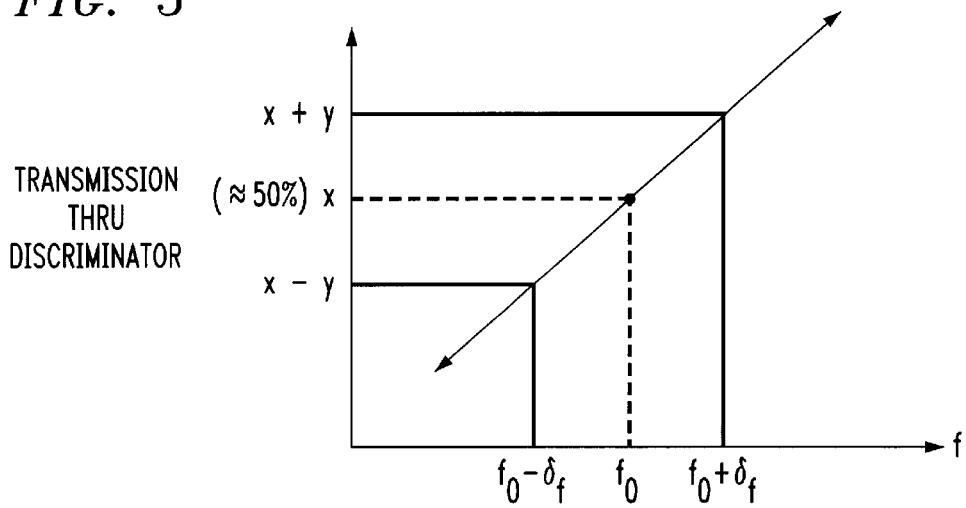
FIG. 5 is a graph that illustrates the power transmission through an optical frequency discriminator, in accordance with one embodiment of the present invention.

FIG. 5 is a graph that illustrates, in accordance with one embodiment of the invention, the power transmission characteristics through optical frequency discriminator 31. As shown, at optical frequency $f_0$, optical frequency discriminator 31 allows power to be transmitted having a value x. The value of x may be any value between 0% and 100%, but is preferably about 50%. Optical frequency $f_0$ corresponds to the channel frequency that is desired to be stabilized. As shown in FIG. 5, at an optical frequency greater than the desired channel frequency, i.e. frequency $f_0 + \delta f$, optical frequency discriminator 31 permits an intensity greater than x to be transmitted through it, while at a lower optical frequency, i.e. frequency $71_0 - \delta f$, optical frequency discriminator 31 permits an intensity less than x to be transmitted through it. Thus, the intensity of the light received by photodetector 36a, and the value of current $I_2$, is dependent on the wavelength of the received light Processor 40, according to one embodiment, is configured to receive the signals generated by diode 35 and to maintain a desired level corresponding to a ratio of the intensity measured by the first photodetector and the intensity measured by the second photodetector. As previously discussed, processor 40 is also configured to provide a feedback control signal to source 10 to adjust the wavelength of the emitted light. Specifically, according to one embodiment of the invention, processor 40 determines a ratio corresponding to $I_1/I_2$, or of the strength of the signal received by one photodetector divided by the strength of the signal received by the other photodetector. Processor 40, according to one embodiment, is also configured to compare the calculated ratio with a reference ratio corresponding to the ratio of the signals at the desired frequency. By comparing the calculated ratio to the reference ratio, processor 40 determines whether the optical frequency emitted by source 10 deviates from the optical frequency desired for the channel. If it does deviate, then processor 40 transmits a feedback control signal to source 10, instructing source 10 to adjust the wavelength (and hence the frequency, also) of the emitted light.

According to one embodiment, processor 40 is programmable so that the user can select a desired channel frequency. In one embodiment, a reference ratio is selected depending on the desired frequency of the channel. For instance, at a first desired channel frequency, a reference ratio y is selected and compared to the measured ratio, and the optical frequency of the light emitted by source 10 is adjusted if the measured ratio deviates from y. At a second desired channel frequency, a reference ratio z is selected and compared to the measured ratio, and the optical frequency of the light emitted by source 10 is adjusted if the measured ratio deviates from z.

Figure 6:
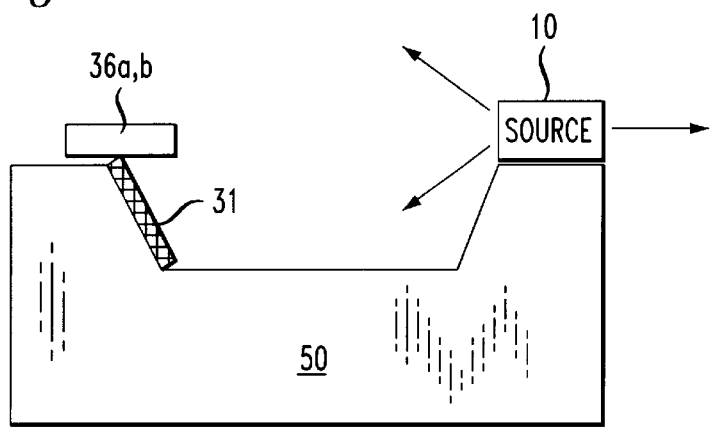
FIG. 6 illustrates a single chip employing back-facet light emitted by a laser, in accordance with one embodiment of the invention.

In another embodiment of the invention, the sample of the light that is utilized by the invention is a back-facet emission of the laser or light source. The back-facet emission of a laser is a small fraction of light emitted by the laser in a direction opposite to the fiber-optic cable. FIG. 6 illustrates one embodiment, in which, upon a single silicon chip 50, is disposed a pair of photodetector elements 36*a* and *b* that receive a sample of light via the back-facet emission of a laser. According to the geometry of the chip, the embodiments of which are numerous, optical frequency discriminator 31 is also configured on the chip so as to modify the intensity of the light received by one of the photodetectors proportional to the optical frequency of the light, while the intensity of the light received by the other photodetector is not modified proportional to the optical frequency.

In one embodiment, optical frequency discriminator 31 is a dielectric coating that is applied directly to a base surface of a mirrored silicon chip, as shown. In this embodiment, the back-facet light of the laser is reflected onto one photodetector element through the coating, but is received by the other photodetector element without being reflected through the coating by the mirrored silicon base.

Figure 7:
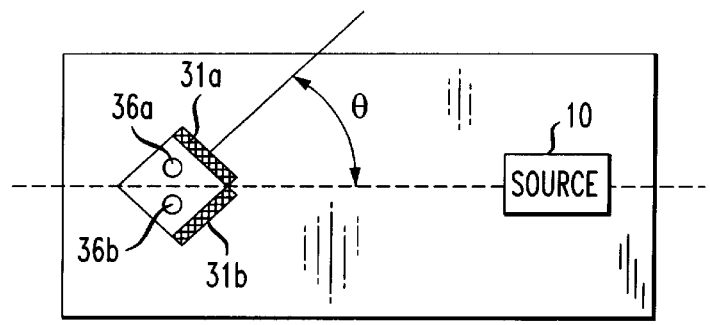
FIG. 7 illustrates a single chip employing back-facet light emitted by a laser, in accordance with another embodiment of the invention.

In another embodiment, optical frequency discriminator 31 is disposed between both photodetector elements and the back-facet emission of a laser on a single chip. FIG. 7 illustrates a silicon chip on which back-facet light emitted by a laser is received by photodetectors 36*a* and 36*b* via optical frequency discriminators 31*a* and 31*b*, which are surfaces disposed between the laser and the photodetectors, at an angle θ from the axis of the laser. The intensity of the light received by each photodetector corresponds to the angle θ. Preferably, according to this embodiment, optical frequency discriminators 31*a* and 31*b* are surfaces upon which is applied a dielectric coating, wherein the dielectric coating has the transmission characteristics described in FIG. 5.

Figure 8:
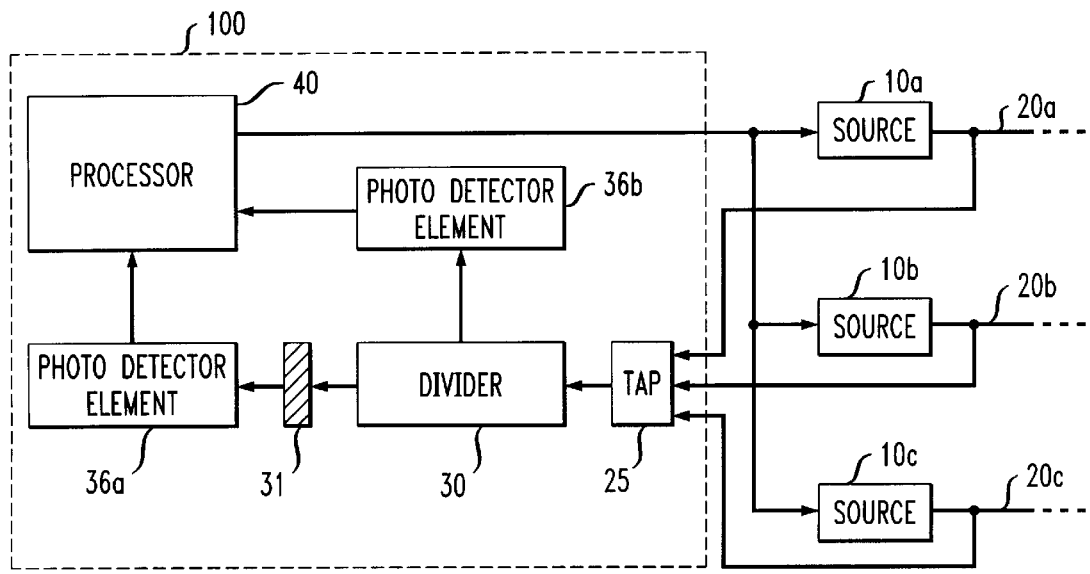
FIG. 8 illustrates a single wavelength administrator that periodically taps a plurality of sources, in accordance with another embodiment of the invention.

According to another embodiment, the present invention is employed by a plurality of laser or light sources. For instance, as illustrated in FIG. 8, a single wavelength administrator 100 periodically taps a plurality of sources 10*a,* 10*b* and 10*c* each configured to emit light for a transmission over fiber-optic cables 20*a,* 20*b* and 20*c* respectively, in order to determine whether each source is stabilized. If not, the previously described aspects of the present invention would be employed to stabilize the laser before tapping a different source.

Figure 9:
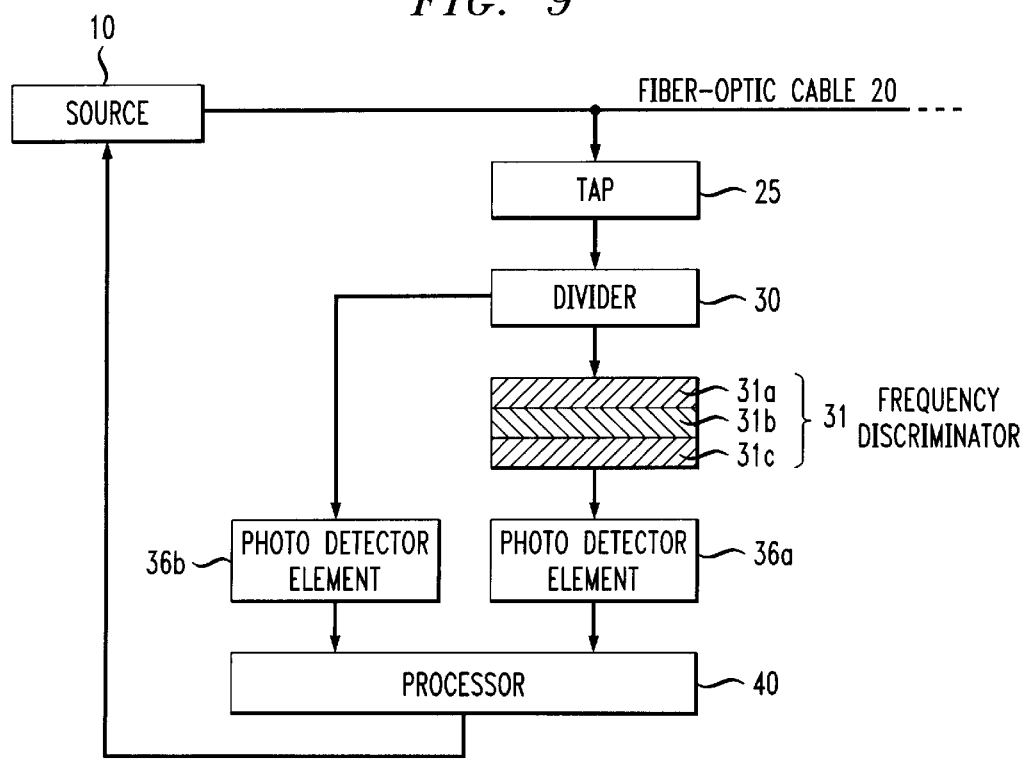
FIG. 9 illustrates an apparatus wherein the optical frequency discriminator comprises a plurality of sandwiched layers or filters, in accordance with another embodiment of the invention.

According to another embodiment, the number of layers of optical frequency discriminator 31, such as when optical frequency discriminator 31 is a tinted filter or wafer, or a dielectric coating, is adjustable. According to this embodiment, filter layers can be sandwiched together so as adjust the intensity of the light received by a photodetector element. FIG. 9 illustrates an apparatus to stabilize the wavelength of a laser or light source, wherein optical frequency discriminator 31 comprises a plurality of sandwiched layers or filters 31*a,* 31*b* and 31*c* to permit the adjustment of the intensity of the light received by photodetector elements 36*a* and 36*b*.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

We claim:

1. An apparatus for stabilizing the wavelength of light emitted by a source, comprising:

a divider for dividing a sample of said emitted light into a first portion and a second portion;

a first photodetector configured to measure an intensity of said first portion;

an optical frequency discriminator configured to modify an intensity of said second portion as a function of an optical frequency of said emitted light;

a second photodetector configured to measure said modified intensity;

a processor configured to stabilize the wavelength of light emitted by said source by determining a ratio corresponding to said intensity measured by said first photodetector and said modified intensity measured by said second photodetector, and to provide a feedback control signal to said source to adjust said wavelength of said emitted light so as to maintain said ratio at a desired, substantially constant level.

2. The apparatus according to claim 1, wherein said first and second photodetectors are photodetector diodes, said diode having a base electrode, a first electrode and a second electrode, said diode configured to generate an electrical current between said base electrode and said first electrode corresponding to said intensity of light received by said first photodetector, said diode further configured to generate an electrical current between said base electrode and said second electrode corresponding to said intensity of light received by said second photodetector.

3. The apparatus according to claim 1, wherein said optical frequency discriminator is a dielectric coating.

4. The apparatus according to claim 3, wherein said dielectric coating is applied to said second photodetector.

5. The apparatus according to claim 1, wherein said source is a laser employing wavelength division multiplexing, said laser configured to generate signals for wavelength division multiplexed transmission via a fiber-optic cable.

6. The apparatus according to claim 1, wherein said sample is tapped from said light emitted from said source.

7. The apparatus according to claim 1, wherein said sample is a back-facet emission emitted by said source.

8. The apparatus according to claim 7, wherein said entire apparatus is disposed on a silicon chip.

9. The apparatus according to claim 8, wherein said silicon chip has a surface that is mirrored, and said optical frequency discriminator is a dielectric coating that is applied directly to said surface of said mirrored silicon chip.

10. The apparatus according to claim 8, wherein said optical frequency discriminator is a dielectric coating that is applied to two surfaces, each said surface disposed between said source and said first and second photodetectors, each said surface disposed at an angle relative to an axis of said laser such that said intensity of light received by said photodetectors corresponds to said angle.

11. The apparatus according to claim 1, wherein said processor is programmable so as to permit a user to select a desired channel frequency.

12. The apparatus according to claim 1, wherein said apparatus is employed by a plurality of sources to determine whether a wavelength of each said source is stabilized.

13. The apparatus according to claim 1, wherein said optical frequency discriminator further comprises a plurality of layers.

14. A method for stabilizing the wavelength of light emitted by a source, said method comprising the steps of:

dividing a sample of said emitted light into a first portion and a second portion;

measuring an intensity of said first portion via a first photodetector;

modifying an intensity of said second portion of said emitted light as a function of an optical frequency of said emitted light via an optical frequency discriminator;

measuring said modified intensity of said second portion via a second photodetector, determining a ratio of said intensity measured by said first photodetector and said intensity measured by said second photodetector;

providing a feedback control signal to said source to adjust the wavelength of said emitted light so as to maintain said ratio at a desired, substantially constant level.

15. The method according to claim 14, wherein said first and second photodetectors are photodetector diodes, said diode having a base electrode, a first electrode and a second electrode, said method further comprising the steps of:

generating an electrical current between said base electrode and said first electrode corresponding to said intensity of light received by said first photodetector;

generating an electrical current between said base electrode and said second electrode corresponding to said intensity of light received by said second photodetector.

16. The method according to claim 14, further comprising modifying said second portion of said emitted light with a dielectric coating.

17. The method according to claim 16, wherein said modifying step comprises applying said dielectric coating on said second photodetector.

18. The method according to claim 14, further comprising the step of generating via a laser signals for wavelength division multiplexed transmission via a fiber-optic cable.

19. The method according to claim 14, further comprising the step of tapping said sample from said light emitted from said source.

20. The method according to claim 14, further comprising the step of receiving said sample as a back-facet emission of said source.

21. The method according to claim 20, further comprising the step of disposing said entire apparatus on a silicon chip.

22. The method according to claim 21, wherein said silicon chip has a surface that is mirrored, said method further comprising the step of applying a dielectric coating directly on said surface of said mirrored silicon chip.

23. The method according to claim 21, wherein said method further comprises the step of applying a dielectric coating to two surfaces, each said surface disposed between said source and said first and second photodetectors, each said surface disposed at an angle relative to an axis of said laser such that said intensity of light received by said photodetectors corresponds to said angle.

24. The method according to claim 14, further comprising the step of programming said processor so as to select a reference ratio corresponding to a desired channel frequency.

25. The method according to claim 14, further comprising the step of determining for a plurality of sources whether a wavelength of each said source is stabilized.

26. The method according to claim 14, further comprising the step of modifying said second portion of said emitted light with a plurality of optical frequency discriminating layers.

* * * * *